United States Patent

Lee

[11] Patent Number: 6,057,232
[45] Date of Patent: May 2, 2000

[54] WIRING STRUCTURE FOR SEMICONDUCTOR DEVICE AND FABRICATION METHOD THEREFOR

[75] Inventor: Chang-Jae Lee, Choongchungbook-Do, Rep. of Korea

[73] Assignee: LG Semicon Co., Ltd., Cheongju, Rep. of Korea

[21] Appl. No.: 08/862,926

[22] Filed: May 27, 1997

Related U.S. Application Data

[62] Division of application No. 08/494,645, Jun. 23, 1995, Pat. No. 5,656,860.

[30] Foreign Application Priority Data

Apr. 1, 1995 [KR] Rep. of Korea ............... 7653/1995

[51] Int. Cl.$^7$ ............................................. H01L 21/44
[52] U.S. Cl. .................... 438/658; 438/659; 438/672; 438/675; 438/687
[58] Field of Search .................. 438/642, 652, 438/653, 660, 670, 688, 643, 648, 658, 659, 672, 675, 687

[56] References Cited

U.S. PATENT DOCUMENTS

| | | | |
|---|---|---|---|
| 4,361,599 | 11/1982 | Wourms ................................. | 257/751 |
| 4,525,434 | 6/1985 | Morikawa et al. ..................... | 428/674 |
| 4,742,014 | 5/1988 | Hooper et al. ........................ | 437/200 |
| 4,977,440 | 12/1990 | Stevens ................................ | 257/767 |
| 5,019,531 | 5/1991 | Awaya et al. ........................ | 437/180 |
| 5,130,274 | 7/1992 | Harper et al. ........................ | 437/195 |
| 5,447,599 | 9/1995 | Li et al. ................................ | 216/17 |
| 5,633,199 | 5/1997 | Fiordalice et al. .................... | 438/642 |
| 5,652,180 | 7/1997 | Shinriki et al. ...................... | 437/190 |

*Primary Examiner*—David Nelms
*Assistant Examiner*—Reneé R. Berry
*Attorney, Agent, or Firm*—Fleshner & Kim, LLP

[57] ABSTRACT

A metal wiring for semiconductor devices having a double-layer passivation film structure consisting of an intermetallic compound layer formed on a copper thin film and made of a metal reacting with copper to form an intermetallic compound and a metal nitride layer formed over the intermetallic compound. This double-layer passivation film structure is obtained by depositing a metal layer, capable of reacting with copper to form an intermetallic compound, over the copper wiring, and annealing the metal layer in a nitrogen atmosphere, thereby forming an intermetallic compound layer over the copper wiring. By virtue of the double-layer passivation film structure, the copper wiring has a great improvement in the reliability. A metal silicide layer is formed between a diffusion region and a diffusion barrier layer in the contact hole of the semiconductor device. The diffusion barrier layer, which is formed on an insulating layer doped with nitrogen ions, is changed into a metal nitride film. Accordingly, a reduced ohmic contact resistance and an improved passivation reliability are achieved.

27 Claims, 6 Drawing Sheets

WIRING STRUCTURE FOR SEMICONDUCTOR DEVICE AND FABRICATION METHOD THEREFOR

This application is a divisional of application Ser. No. 08/494,645 filed Jun. 23, 1995, now U.S. Pat. No. 5,656,860.

BACKGROUND OF THE INVENTION

1. Field of the Invention

The present invention relates to wiring techniques for semiconductor devices, and more particularly to a wiring structure for highly integrated semiconductor devices having a passivation film disposed on a copper thin film for the wiring and made of an intermetallic compound formed by a reaction with copper to improve the conductivity and reliability of the copper wiring.

2. Description of the Prior Art

As semiconductor devices recently developed require a more rapid operation speed thereof because their integration degree has been abruptly increased. Due to such a requirement, a large amount of current flows through wirings of the semiconductor devices.

The increased integration degree of such semiconductor devices involves inevitably a decrease in line width of wirings, thereby increasing the density of current flowing through the wirings.

To this end, inexpensive aluminum exhibiting a good ohmic contact characteristic and a high conductivity have been used to make wirings or via lines. Where pure aluminum is used to make wirings, subsequent processes to be carried out after the formation of pure aluminum wirings should be those of low temperature. Moreover, such pure aluminum wirings involve a junction spike or an electromigration.

Due to such disadvantage of pure aluminum, aluminum alloys added with Si, Cu, Ni or Cr have been mainly used to make wirings of semiconductor devices, in place of pure aluminum.

Considering that the high integration of semiconductor devices are progressing continuously, such aluminum alloy wirings also have many disadvantages in terms of resistance and reliability, as in the pure aluminum wirings. For solving this problem, there has been proposed use of copper exhibiting a better conductivity than that of aluminum alloy by two times or greater.

In case of copper wirings, diffusion of copper to silicon substrates may occur. Moreover, the copper may be easily oxidized or etched by air existing in the atmosphere or process atmospheres used in process steps. Copper also has a poor adhesion to insulating layers containing oxygen.

Many researches and developments have been made in order to overcome the above-mentioned problems. One is disclosed in U.S. Pat. No. 4,742,014 relating to fabrication of copper wiring structures for semiconductor devices. Referring to FIGS. 1A to 1C, this method will be described.

As shown in FIG. 1A, a substrate 1 made of single crystalline silicon is formed with a diffusion region 2 near its surface. An insulating layer 3 is then coated over the surface of silicon substrate 1.

In order to expose the diffusion region 2, the insulating layer 3 is then partially removed at its portion disposed over the diffusion region 2, thereby forming a contact hole 4.

Over the entire exposed surface of the resulting structure including the surface of insulating film 3 and the surface of exposed diffusion region 2, a molybdenum thin film 5 is deposited using a sputtering method or a chemical vapor deposition method, as shown in FIG. 1B.

Thereafter, a copper thin film 6 is coated over the molybdenum thin film 5. The copper thin film 6 and molybdenum thin film 5 are sequentially patterned in this order.

As shown in FIG. 1C, a tungsten thin film 7 is then selectively deposited over only the patterned copper thin film 6 using a selective tungsten deposition method, thereby passivating the copper thin film 6.

Accordingly, the copper thin film 6 is used as a conduction layer whereas the molybdenum thin film 5 is used as a lower diffusion barrier layer for the copper thin film 6. On the other hand, the tungsten thin film 7 deposited on the upper and side surfaces of copper thin film 6 serves as an upper and side diffusion barrier layer for the copper thin film 6. Thus, the copper thin film 6 is encapsulated by the molybdenum thin film 5 of high melting point metal and the tungsten thin film 7.

Where the insulating layer 3 is an oxygen-containing insulating layer, the tungsten thin film 7 serves to prevent the copper thin film 6 from being oxidized by the oxygen of the insulating-layer 3. In this case, the tungsten thin film 7 also prevents the copper atoms of the copper thin film 6 from being diffused in the insulating film 3.

Meanwhile, the molybdenum thin film 5 serves to not only reduce the ohmic contact resistance between the copper thin film 6 and the diffusion region 2, but also to prevent the copper atoms of the copper thin film 6 from being diffused in the insulating film 3.

However, this method has a problem that a complicated fabrication is required to form the lower diffusion barrier layer, the conduction layer, namely, copper layer, and the upper and side diffusion barrier layer.

Furthermore, this method is difficult to prevent the copper thin film from being formed at the surface thereof with a natural oxide film in the atmosphere or a tungsten depositing atmosphere because it uses the selective tungsten deposition technique that is not a completely developed technique. For this reason, the method has a great difficulty to selectively form the tungsten thin film on the copper thin film.

As a means of settling the formation of the natural oxide film on the copper thin film, there has been proposed a method for removing the natural oxide film using a sputtering etch process in an in-situ fashion, prior to the deposition of the tungsten thin film, in the same CVD equipment as that used for the deposition of the tungsten thin film. However, this method has a difficulty to completely remove the residue of natural oxide film left on the side surfaces of copper thin film because it uses the sputtering etch technique having the anisotropic etch characteristic. As a result, it is difficult to form a satisfactory selective tungsten thin film due to the natural oxide film left on the side surfaces of copper thin film.

In this regard, the above-mentioned conventional techniques for passivating wirings of copper thin films using the selective tungsten deposition method need more researches in order to achieve the application of copper thin film wirings to highly integrated semiconductor devices.

Another conventional method for fabricating copper wirings of semiconductor devices is disclosed in U.S. Pat. No. 5,130,274. By referring to FIGS. 2A to 2C, this method will be described.

As shown in FIG. 2A, a copper thin film 11 is coated over the entire surface of a single crystalline silicon substrate (not shown) and then patterned to form a first wiring.

An insulating film 13 comprised of, for example, an oxide film is then deposited over the entire surface of the resulting structure including the surface of the patterned copper thin film 11 and the surface of the silicon substrate exposed after the patterning.

Thereafter, the insulating film 13 is partially removed at its portion corresponding to a region where the copper thin film 11 will be in contact with a copper thin film (not shown) for a second wiring to be subsequently formed, thereby forming a via hole 14.

A thin film 15 made of copper alloy added with aluminum or chromium is then deposited over the entire surface of the resulting structure including the surface of insulating film 13 and the surface of copper thin film 11 exposed through the via hole 14, by using the sputtering method or CVD method.

Subsequently, the copper alloy thin film 15 is etched back so that it is left only in the via hole 14, thereby forming a plug, as shown in FIG. 2B.

The plug comprised of the remaining copper alloy thin film 15 is then annealed in an oxygen atmosphere. During the annealing of the plug, the aluminum or chromium atoms of the plug migrates to the surface of plug and reacts with the oxygen of the insulating film 13 at the interface between the plug and the insulating film 13, thereby forming an oxide film 17 of $Al_2O_3$ or $Cr_2O_3$, as shown in FIG. 2C.

After completing the annealing, the plug buried in the via hole 14 provides a pure copper wiring 16 passivated at its upper and side surfaces by the oxide film 17.

However, this method has a problem that the oxide film provides lower copper diffusion barrier effect than nitride films. Since the aluminum or chromium atoms contained in the copper alloy reacts with oxygen supplied at the surface of the insulating film to form the oxide film in this method, the volume of the pure copper wiring is reduced as the thickness of the oxide film increases. This results in an undesirable increase in the resistance of the pure copper wiring.

SUMMARY OF THE INVENTION

Therefore, an object of the invention is to provide a wiring structure for semiconductor devices having an intermetallic compound layer interposed between a copper wiring and an upper metal layer disposed over the copper wiring, the intermetallic compound layer serving to passivate the copper wiring, thereby capable of achieving high conductivity and reliability of the copper wiring, and a method for fabricating the wiring structure.

In accordance with one aspect, the present invention provides a wiring structure of a semiconductor device, comprising: a substrate; a conduction layer made of a first metal and formed on the substrate, the conduction layer having a required pattern; and an intermetallic compound layer formed over the conduction layer and adapted to passivate the conduction layer, the intermetallic compound layer containing a second metal reacting with the first metal to form an intermetallic compound.

In accordance with another aspect, the present invention provides a wiring structure of a semiconductor device, comprising: a substrate; a diffusion region formed in the substrate; an insulating layer coated over the substrate and provided with a contact hole for exposing the diffusion region and an ion-doped layer disposed near an upper surface of the insulating layer; a diffusion barrier layer disposed on the diffusion region and the insulating film, the diffusion barrier layer having a required pattern; a conduction layer made of a first metal and formed over the diffusion barrier layer; a passivation layer formed over the conduction layer; and a metal silicide layer interposed between the diffusion region and the diffusion barrier layer.

In accordance with another aspect, the present invention provides a method for fabricating a wiring structure of a semiconductor device, comprising the steps of: forming a conduction layer made of a first metal on a substrate such that the conduction layer has a required pattern; and forming over the conduction layer a first intermetallic compound layer containing a second metal reacting with the first metal to form an intermetallic compound.

In accordance with another aspect, the present invention provides a method for fabricating a wiring structure of a semiconductor device, comprising the steps of: forming diffusion regions for the semiconductor device in a substrate; forming an ion-doped layer extending to a required depth in the entire upper surface portion of the insulating layer; removing a portion of the insulating layer corresponding to a selected one of the diffusion regions, thereby forming a contact hole; forming a diffusion barrier layer on the insulating layer and the selected diffusion region in the contact hole such that the diffusion barrier layer has a required pattern, and then forming a conduction layer made of a first metal over the diffusion barrier layer; forming over the conduction layer a first intermetallic compound layer containing a second metal reacting with the first metal to form an intermetallic compound; and subjecting the first intermetallic compound layer to an annealing, thereby changing the first intermetallic compound layer into a second intermetallic compound layer and a metal nitride layer formed over the second intermetallic compound layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
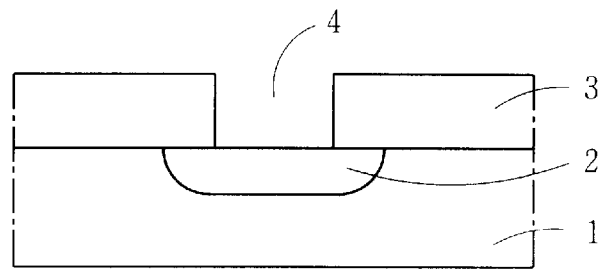
FIGS. 1A to 1C are sectional views respectively illustrating a conventional method for fabricating wiring structures for semiconductor devices.
Figure 1B:
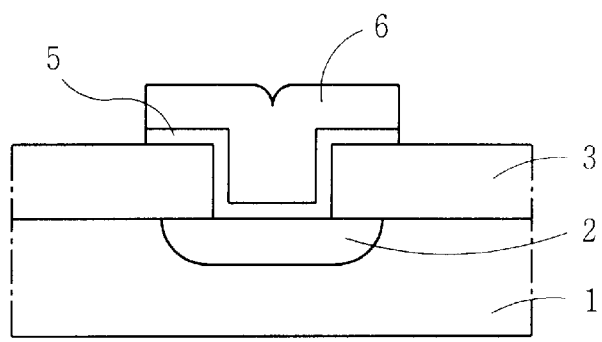
Figure 1C:
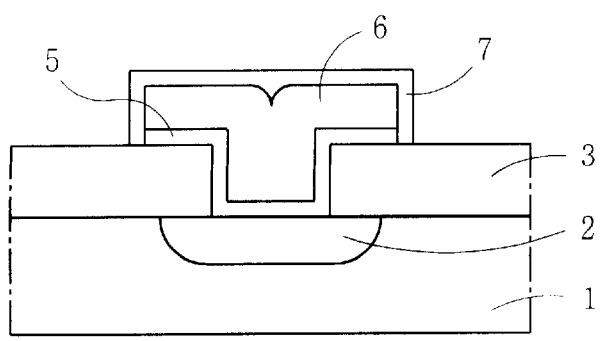
Figure 2A:
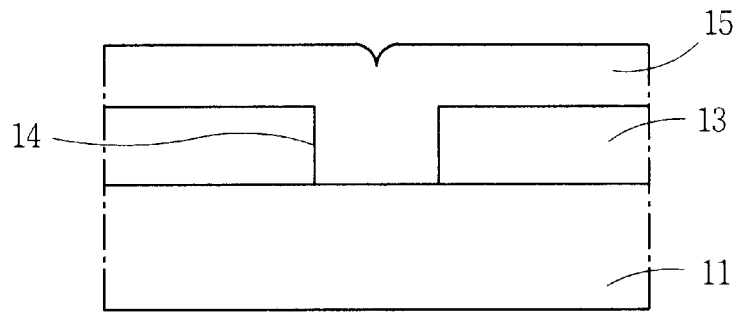
FIGS. 2A to 2C are sectional views respectively illustrating another conventional method for fabricating wiring structures for semiconductor devices.
Figure 2B:
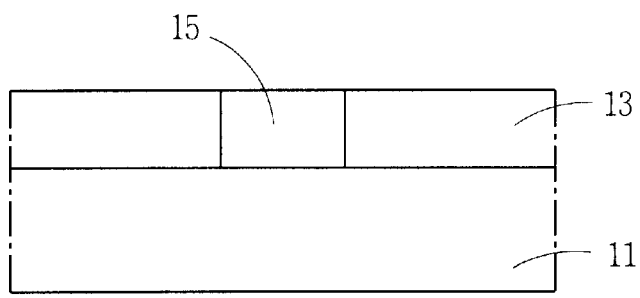
Figure 2C:
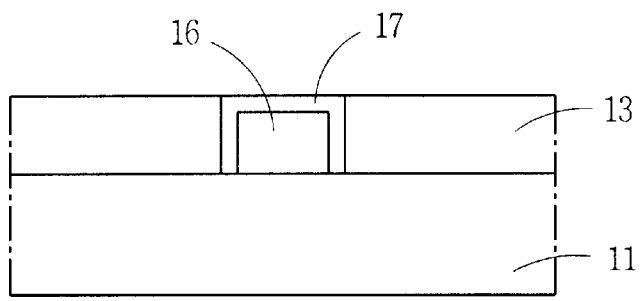
Figure 3:
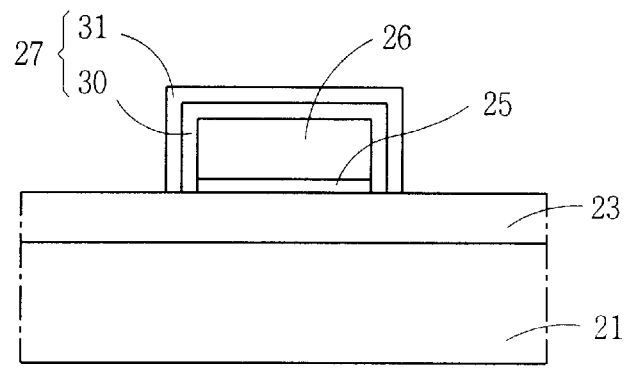
FIG. 3 is a sectional view illustrating a wiring structure for semiconductor devices in accordance with an embodiment of the present invention.

Referring to FIG. 3, there is illustrated a wiring structure for semiconductor devices in accordance with an embodiment of the present invention.

As shown in FIG. 3, the wiring structure of this embodiment includes a substrate 21, an insulating layer 23 coated over the substrate 21, a diffusion barrier layer 25 formed on a desired portion of the insulating layer 23, a copper thin film 26 formed as a conduction, first metal layer over the upper surface of the diffusion barrier layer 25, and a passivation layer 27 formed over the entire surface of the copper thin film 26.

The passivation layer 27 consists of a TiCu layer 30 containing Ti as a second metal forming an intermetallic compound by reacting with the first metal, and a layer 31 made of a metal nitride such as TiN and formed over the TiCu layer 30.

FIGS. 4A to 4E are sectional views respectively illustrating a method for fabricating the wiring structure of FIG. 3 in accordance with the present invention. In FIGS. 4A to 4E, elements respectively corresponding to those in FIG. 3 are denoted by the same reference numerals.

Figure 4A:
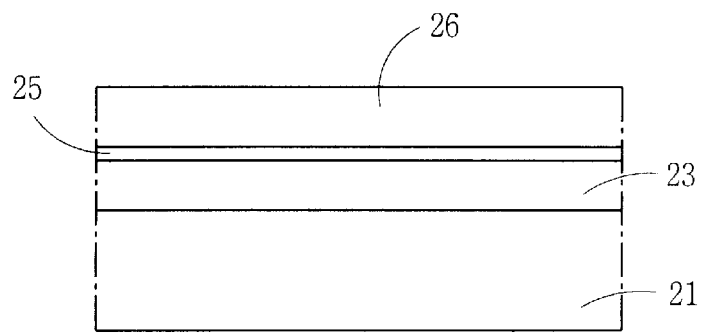
FIGS. 4A to 4E are sectional views respectively illustrating a method for fabricating the wiring structure of FIG. 3 in accordance with the present invention.

In accordance with this method, a semiconductor substrate 21 of single crystalline silicon already subjected to a front end process is prepared first. An insulating film 23 is then coated over the substrate 21, as shown in FIG. 4A.

Over the insulating film 23, a diffusion barrier layer 25 is deposited to a thickness of about 500 Å. The diffusion barrier layer 25 serves as a barrier against diffusion of copper atoms.

The diffusion barrier layer 25 is made of a material selected from a group consisting of a variety of nitrides such as $Si_3N_4$, TiN, Ta or ZrN, high melting point metals such as Mo, Ti, W, Ta or Zr, conductive oxides such as MoO, $RuO_2$ or $Y_2O_3$ and metals, such as La, Mg, Pt, Sr or Y, reacting with copper to form an intermetallic compound. The diffusion barrier layer 25 is formed by depositing the selected material over the insulating film 23 by use of the sputtering method or CVD method.

Subsequently, a thin film 26 made of a first metal such as copper is deposited to a thickness of 5,000 Å over the diffusion barrier layer 25 using the sputtering method or CVD method.

In place of copper, aluminum may be used as the first metal.

Figure 4B:
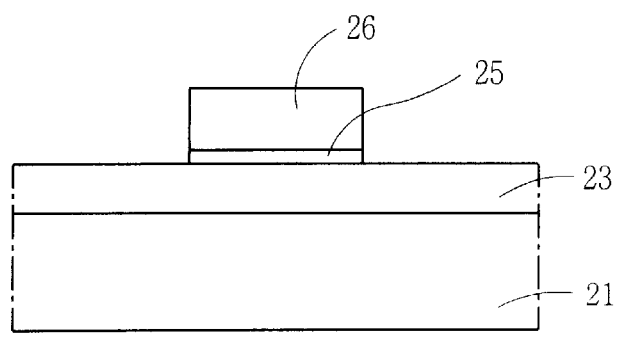

A photoresist film pattern (not shown) corresponding to a pattern for the conduction layer, namely, the copper thin film 26 is then formed on the copper thin film 26, as shown in FIG. 4B. Using the photoresist film pattern as a mask, the copper thin film 26 is then partially dry etched at its portion not masked with the photoresist film pattern in a plasma atmosphere containing an $SiCl_4/Cl_2/N_2$ mixture gas.

Subsequently, the portion of diffusion barrier layer 25 not masked with the photoresist film pattern, namely, exposed after the etching of the copper thin film 26 is dry etched using a suitable gas selected depending on the material of the diffusion barrier layer 25. After completing the etching, the photoresist film pattern is completely removed.

Figure 4C:
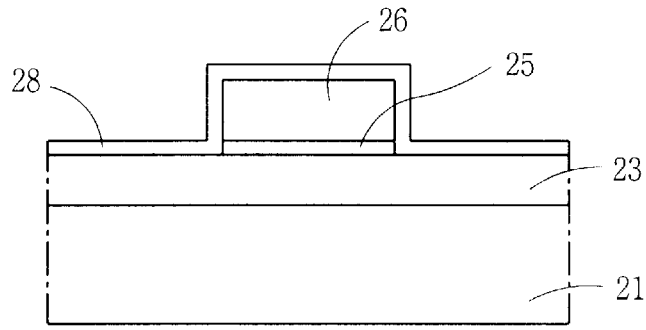

Over the entire surface of the resulting structure including the surface of the remaining copper thin film 26 and the exposed surface of the insulating film 23, a layer 28 made of a second metal, such as Ti, reacting with copper to form an intermetallic compound is deposited to a thickness of 500 Å using the CVD method, as shown in FIG. 4C.

In place of Ti, the second metal layer 28 may be made of one selected from La, Mg, Pt, Sr, Y and Zr.

Figure 4D:
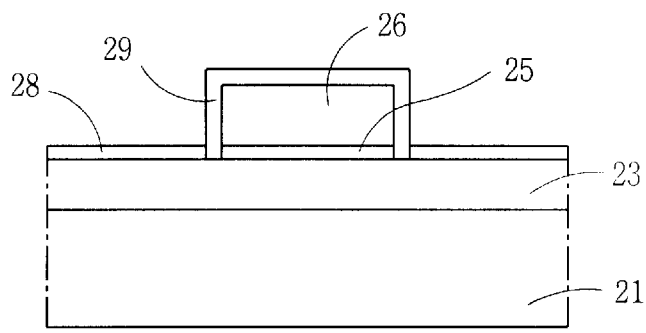

Thereafter, the Ti layer 28 is annealed at a temperature of 350° C. in an inert gas atmosphere to form a first intermetallic compound layer 29 of, for example, $Ti_2Cu$ at its portion being in contact with the surface of copper thin film 26, as shown in FIG. 4D. At other portions, the Ti layer 28 is still kept as it is, without being changed.

Figure 4E:
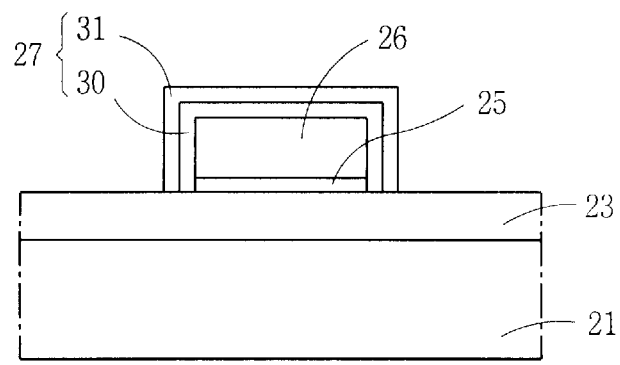

The Ti layer 28 is then subjected to a wet etch at its portions not changed into the first intermetallic compound, as shown in FIG. 4E. This wet etch step is carried out using a wet etch solution which is a $HCl/HNO_3$ mixture acid solution or a $H_2O$-diluted hydrofluoric (HF) acid.

The $Ti_2Cu$ layer 29 is then annealed at a temperature of 700° C. in a nitrogen atmosphere, thereby forming a passivation film 27 consisting of the second metallic compound layer, namely, the TiCu layer 30 and the metal nitride film, namely, the TiN layer 31 formed over the TiCu layer 30.

As the annealing in the nitrogen atmosphere, one is selected from a plasma annealing using $N_2$ or $NH_3$ gas, a furnace annealing and a rapid annealing.

On the other hand, the TiN layer 31 may be substituted by other metal nitride layers. For example, a Ti-Cu-N layer may be used. It is also apparent that in case the second metal is Zr, the TiN layer 31 is substituted by a Zr layer or a metal nitride layer such as a Zr-Cu-N layer.

Figure 5:
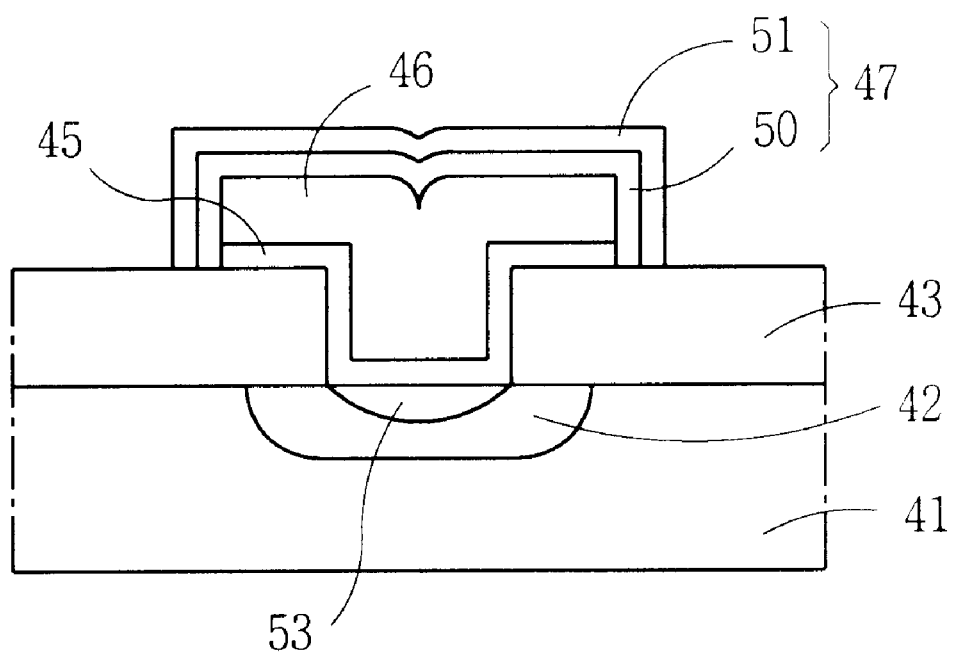
FIG. 5 is a sectional view illustrating a wiring structure for semiconductor devices in accordance with another embodiment of the present invention.

Referring to FIG. 5, there is illustrated a wiring structure for semiconductor devices in accordance with another embodiment of the present invention.

As shown in FIG. 5, the wiring structure of this embodiment includes a substrate 41 provided at its surface portion with a diffusion region 42, and an insulating layer 43 coated over the substrate 41. The insulating layer 43 has a contact hole 42 for exposing the diffusion region 42 and an ion-doped layer disposed near the surface of insulating layer 43. A diffusion barrier layer 45 having a desired pattern is disposed on the diffusion region 42 and the insulating film 43. The wiring structure further includes a copper thin film 46 formed as a conduction, first metal layer over the diffusion barrier layer 45, a passivation layer 47 formed over the copper thin film 46 and a silicide layer 53 interposed between the diffusion region 42 and the diffusion barrier layer 45.

The passivation layer 47 consists of a TiCu layer 50 containing Ti as a second metal forming an intermetallic compound by reacting with the first metal, and a layer 51 made of a metal nitride such as TiN and formed over the TiCu layer 47.

Figure 6A:
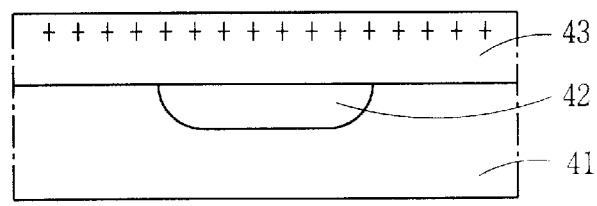
FIGS. 6A to 6C are sectional views respectively illustrating a method for fabricating the wiring structure of FIG. 5 in accordance with the present invention.
Figure 6B:
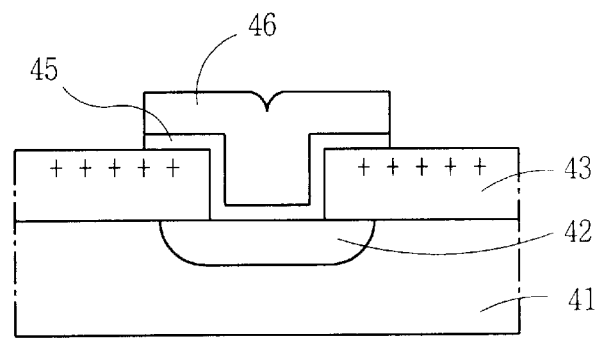
Figure 6C:
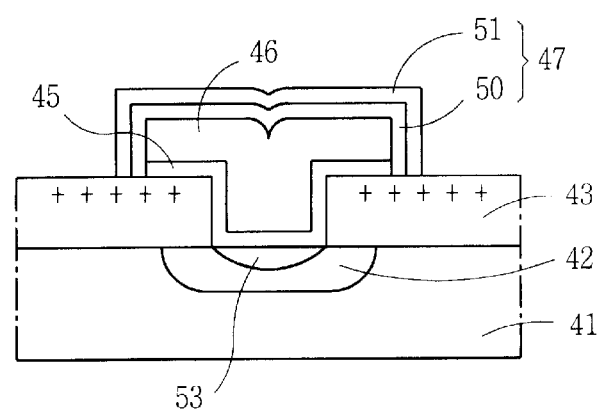

FIGS. 6A to 6C are sectional views respectively illustrating a method for fabricating the wiring structure of FIG. 5 in accordance with the present invention. In FIGS. 6A to 6C, elements respectively corresponding to those in FIG. 5 are denoted by the same reference numerals.

In accordance with this method, a diffusion region 42 is formed first in a semiconductor substrate 41 of single crystalline silicon, as shown in FIG. 6A. An insulating film 43 is then coated over the substrate 41.

Thereafter, nitrogen ions are implanted to a small depth in the insulating layer 43 so that they are filed up in a portion of the insulating layer 43 near the insulating layer surface.

Thereafter, a contact hole is formed in the insulating layer 43 in order to expose a desired portion of the diffusion region 42, as shown in FIG. 6B.

Over the entire surface of the resulting structure including the exposed surface of the diffusion region 42 and the surface of the remaining insulating layer 43, a Ti layer is deposited to a thickness of about 500 Å as a diffusion barrier layer 45. Over the Ti layer, a thin film 46 made of a first metal such as copper is deposited to a thickness of 1000 Å.

In place of the Ti layer, the diffusion barrier layer 45 may be comprised of other layer made of a material, such as Zr, Ta or Co, reacting with single crystalline silicon to form a metal silicide and reacting with nitride to form a metal nitride.

In place of copper, aluminum may be used as the first metal.

A photoresist film pattern (not shown) corresponding to a pattern for the conduction layer, namely, the copper thin film 46 is then formed on the copper thin film 46. Using the photoresist film pattern as a mask, the copper thin film 46 and Ti layer 45 are then sequentially etched at their portions not masked with the photoresist film pattern, as shown in FIG. 6B. After completing the etching, the photoresist film pattern is completely removed.

Thereafter, process steps similar to those shown in FIGS. 4C to 4E are carried out to form a first intermetallic compound layer 50 comprised of a $Ti_2Cu$ layer over the remaining copper thin film 46. The $Ti_2Cu$ layer is then changed into a passivation film 47 consisting of a second metallic compound layer comprised of the TiCu layer 50 and a metal nitride film comprised of a TiN layer 51 formed over the TiCu layer 50, as shown in FIG. 6C.

During the formation of the passivation film 47, a silicide layer 53 made of, for example, $TiSi_2$ is formed between the diffusion region 42 and the diffusion barrier layer 45. This silicide layer 53 serves to reduce the ohmic contact resistance of the wiring comprised of the copper thin film 46. During the formation of the passivation film 47, Ti of the diffusion barrier layer 45 also reacts with the nitrogen implanted in the insulating layer 43, so that the Ti layer 45 is changed into a TiN layer.

The TiN layer 51 may be substituted by other metal nitride layers. For example, a Ti-Cu-N layer may be used. It is also apparent that in case the second metal is Zr, the TiN layer 51 is substituted by a Zr layer or a metal nitride layer such as a Zr-Cu-N layer.

As apparent from the above description, the present invention achieves an easy formation of the passivation film on the copper wiring by depositing a metal layer, capable of reacting with copper to form an intermetallic compound, over the copper wiring, and annealing the metal layer in an inert gas atmosphere, thereby forming an intermetallic compound layer over the copper wiring. In accordance with the present invention, the passivation film has a double-layer structure because a metal nitride is formed over the intermetallic compound layer by annealing the intermetallic compound in a nitrogen atmosphere. By virtue of the double-layer passivation film structure, the copper wiring has a great improvement in the reliability.

In accordance with the present invention, a reduced ohmic contact resistance and an improved passivation reliability are achieved by virtue of the formation of a metal silicide layer in the contact hole and the change of the diffusion barrier layer on the insulating film into a metal nitride film.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a wiring structure of a semiconductor device, comprising the steps of:
   forming a conduction layer made of a first metal on a substrate such that the conduction layer has a required pattern;
   forming over the conduction layer a reaction layer containing a second metal;
   performing a first annealing process to cause the second metal to react with the first metal to form a first intermetallic compound layer; and
   performing a second annealing process to form a second intermetallic compound layer and a metal nitride layer formed over the second intermetallic compound layer.

2. A method in accordance with claim 1, further comprising the step of:
   removing portions of the reaction layer that have not reacted to form the first intermetallic compound layer.

3. A method in accordance with claim 1, wherein the first metal comprises one of copper and aluminum.

4. A method in accordance with claim 1, wherein the second metal comprises one selected from a group consisting of Si, La, Mg, Pt, Sr, Y, Ti and Zr.

5. A method in accordance with claim 1, wherein the first intermetallic compound layer is made of $Ti_2Cu$, and the second intermetallic compound layer is made of TiCu.

6. A method in accordance with claim 1, wherein the metal nitride layer is made of TiN.

7. A method in accordance with claim 1, wherein the metal nitride layer is made of a Ti-Cu-N-based metal nitride.

8. A method in accordance with claim 1, wherein the metal nitride layer is made of a Zr-Cu-N-based metal nitride.

9. A method in accordance with claim 1, wherein the metal nitride layer is made of ZrN. layer into a second intermetallic compound layer and a metal nitride layer formed over the second intermetallic compound layer.

10. A method for fabricating a wiring structure of a semiconductor device, comprising the steps of:
    forming diffusion regions for the semiconductor device in a substrate;
    forming an insulating layer on the substrate;
    forming an ion-doped layer in an upper surface portion of the insulating layer;
    removing a portion of the insulating layer corresponding to a selected one of the diffusion regions, thereby forming a contact hole;
    forming a diffusion barrier layer on the insulating layer and the selected diffusion region in the contact hole, and then forming a conduction layer made of a first metal over the diffusion barrier layer;
    forming over the conduction layer a first intermetallic compound layer containing a second metal that reacts with the first metal to form an intermetallic compound; and
    annealing the device structure to change a portion of the first intermetallic compound layer into a second intermetallic compound layer and to form a metal nitride layer over the second intermetallic compound layer, and to change a portion of the diffusion barrier layer in contact with the ion-doped layer into a metal nitride layer.

11. A method in accordance with claim 10, wherein the ion-doped layer is comprised of a layer doped with nitrogen ions.

12. A method in accordance with claim 10, wherein, a metal silicide layer is formed between the selected diffusion region and the diffusion barrier layer during the annealing step.

13. A method in accordance with claim 10, wherein the diffusion barrier layer is made of a material selected from a group consisting of Ti, Zr, Ta and Co.

14. A method in accordance with claim 1, wherein the second intermetallic compound layer and the metal nitride layer form a passivation layer.

15. A method in accordance with claim 10, wherein the diffusion barrier layer is interposed between the insulating layer and the conduction layer.

16. A method in accordance with claim 10, wherein the insulating layer is formed over the substrate including the diffusion regions.

17. A method for making a wiring structure, comprising:

forming an insulating layer on a substrate;

doping an upper surface of the insulating layer with nitrogen ions;

forming a diffusion barrier layer over the insulation layer;

forming a conduction layer made of a first metal on the diffusion barrier layer such that the conduction layer has a required pattern;

forming a reaction layer containing a second metal over the conduction layer; and annealing the resulting structure to cause the nitrogen ions in the insulating layer to react with the diffusion barrier layer to form a metal nitride layer between the insulation layer and the conduction layer.

18. The method of claim 17, wherein the annealing step also causes a silicide layer to be formed between the substrate and the diffusion barrier layer.

19. A method for fabricating a wiring structure of a semiconductor device, comprising the steps of:

forming a conduction layer made of a first metal on a substrate such that the conduction layer has a required pattern;

forming over the conduction layer a reaction layer containing a second metal;

performing an annealing process to cause the second metal to react with the first metal to form an intermetallic compound layer; and forming a metal nitride layer over the intermetallic compound layer.

20. A method in accordance with claim 19, further comprising the step of annealing the intermetallic compound layer.

21. A method in accordance with claim 20, wherein the step of annealing the intermetallic compound layer comprises forming a second intermetallic compound layer and a metal nitride layer formed over the second intermetallic compound layer.

22. A method in accordance with claim 21, wherein the second intermetallic compound layer and the metal nitride layer form a passivation layer.

23. A method in accordance with claim 22, wherein the first intermetallic compound layer is made of $Ti_2Cu$, and the second intermetallic compound layer is made of TiCu.

24. A method for fabricating a wiring structure of a semiconductor device, comprising the steps of:

forming an insulating layer on a substrate;

forming a contact hole in the insulating layer to expose a portion of the substrate;

forming a diffusion barrier layer over the insulating layer and in the contact hole;

forming a conduction layer made of a first metal on the diffusion barrier layer on a substrate such that the conduction layer has a required pattern;

forming over the conduction layer a reaction layer containing a second metal; and performing an annealing process to cause the second metal to react with the first metal to form an intermetallic compound layer.

25. A method in accordance with claim 24, further comprising the step of annealing the intermetallic compound layer to form a second intermetallic compound layer and a metal nitride layer formed over the second intermetallic compound layer.

26. A method in accordance with claim 25, wherein the second intermetallic compound layer and the metal nitride layer form a passivation layer.

27. A method in accordance with claim 25, wherein the first intermetallic compound layer is made of $Ti_2Cu$, and the second intermetallic compound layer is made of TiCu.

* * * * *